United States Patent
Weng et al.

(10) Patent No.: US 9,547,031 B2
(45) Date of Patent: Jan. 17, 2017

(54) FLIPPED CELL SENSOR PATTERN

(71) Applicant: Parade Technologies, Ltd., Santa Clara, CA (US)

(72) Inventors: Xiaoping Weng, Shanghai (CN);
Yingzhu Deng, Shanghai (CN);
Benjamin Avery, Bellingham, WA (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 277 days.

(21) Appl. No.: 14/303,881

(22) Filed: Jun. 13, 2014

(65) Prior Publication Data
US 2015/0008941 A1  Jan. 8, 2015

Related U.S. Application Data

(63) Continuation of application No. 13/918,252, filed on Jun. 14, 2013, now Pat. No. 8,754,662.

(60) Provisional application No. 61/776,405, filed on Mar. 11, 2013.

(51) Int. Cl.
*G01R 27/26* (2006.01)
*G06F 3/044* (2006.01)

(52) U.S. Cl.
CPC ........... *G01R 27/2605* (2013.01); *G06F 3/044* (2013.01)

(58) Field of Classification Search
CPC .............................. G06F 3/044; G01R 27/2605
USPC ........................... 324/658–690; 345/173–178
See application file for complete search history.

(56) References Cited

U.S. PATENT DOCUMENTS

| 4,233,522 A | 11/1980 | Grummer et al. |
| 4,707,845 A | 11/1987 | Krein et al. |
| 6,590,629 B1 | 7/2003 | Hirobe et al. |
| 7,202,855 B2 | 4/2007 | Shigetaka et al. |
| 7,423,635 B2 | 9/2008 | Taylor et al. |

(Continued)

FOREIGN PATENT DOCUMENTS

| DE | 202012101378 U1 | 4/2012 |
| JP | 2010205177 A | 9/2010 |
| WO | 2011142589 A | 11/2011 |
| WO | 2012176639 A | 12/2012 |

OTHER PUBLICATIONS

"Chapter A: Wire Bonding" <www.vps.nu/img/image/Docs/safe%20light.pdf> Jun. 4, 1999 (Accessed Jun. 11, 2013).

(Continued)

*Primary Examiner* — Jeff Natalini
(74) *Attorney, Agent, or Firm* — Morgan, Lewis & Bockius LLP

(57) ABSTRACT

Embodiments of a capacitive sensor array may comprise a plurality of large sensor electrodes and, for each of the large sensor electrodes, a first plurality of small sensor electrodes each capacitively coupled with the large sensor electrode, and each conductively coupled by one of a first set of routing traces to one of a first set of conductors located in a first edge region, and a second plurality of small sensor electrodes capacitively coupled with the large sensor electrode and conductively coupled by a second set of routing traces to a second set of conductors in a second edge region. The first set of routing traces is located in a first routing channel and the second set of routing traces is located in a second routing channel, where the first and second routing channels are located along different sides of the large sensor electrode.

18 Claims, 13 Drawing Sheets

(56) References Cited

U.S. PATENT DOCUMENTS

| | | | |
|---|---|---|---|
| 7,499,039 B2 | 3/2009 | Roberts | |
| 7,639,234 B2 | 12/2009 | Orsley | |
| 7,821,425 B2 | 10/2010 | Philipp | |
| 7,973,771 B2 | 7/2011 | Geaghan | |
| 8,072,429 B2 | 12/2011 | Grivna | |
| 8,149,207 B2 | 4/2012 | Lai | |
| 8,243,027 B2 | 8/2012 | Hotelling et al. | |
| 8,274,488 B2 | 9/2012 | Bae | |
| 8,294,687 B1 | 10/2012 | Ksondzyk | |
| 8,300,019 B2 | 10/2012 | Elias et al. | |
| 8,754,662 B1 * | 6/2014 | Weng | G01R 27/2605 324/686 |
| 9,292,138 B2 * | 3/2016 | Gourevitch | G06F 3/044 |
| 2005/0280639 A1 | 12/2005 | Taylor et al. | |
| 2007/0008299 A1 | 1/2007 | Hristov | |
| 2007/0074913 A1 | 4/2007 | Geaghan et al. | |
| 2007/0279395 A1 | 12/2007 | Philipp et al. | |
| 2008/0143683 A1 | 6/2008 | Hotelling | |
| 2009/0090694 A1 | 4/2009 | Hotelling et al. | |
| 2009/0273570 A1 | 11/2009 | Degner et al. | |
| 2009/0314621 A1 | 12/2009 | Hotelling | |
| 2010/0013800 A1 | 1/2010 | Elias et al. | |
| 2010/0079384 A1 | 4/2010 | Grivna | |
| 2010/0108409 A1 | 5/2010 | Tanaka et al. | |
| 2010/0149108 A1 | 6/2010 | Hotelling et al. | |
| 2010/0214247 A1 | 8/2010 | Tang et al. | |
| 2010/0214260 A1 | 8/2010 | Tanaka et al. | |
| 2010/0220071 A1 | 9/2010 | Nishihara et al. | |
| 2010/0321331 A1 | 12/2010 | Oda et al. | |
| 2011/0012845 A1 | 1/2011 | Rothkopf et al. | |
| 2011/0018841 A1 | 1/2011 | Hristov | |
| 2011/0148785 A1 | 6/2011 | Oda et al. | |
| 2011/0170099 A1 | 7/2011 | Ko | |
| 2011/0215814 A1 | 9/2011 | Dorrough | |
| 2012/0050180 A1 | 3/2012 | King et al. | |
| 2012/0162144 A1 | 6/2012 | Faahraeus et al. | |
| 2012/0227259 A1 | 9/2012 | Badaye et al. | |
| 2012/0255167 A1 | 10/2012 | Badaye et al. | |
| 2012/0256642 A1 | 10/2012 | Badaye et al. | |
| 2012/0306792 A1 | 12/2012 | Powers | |
| 2013/0100038 A1 * | 4/2013 | Yilmaz | G06F 3/044 345/173 |
| 2013/0100041 A1 * | 4/2013 | Golovchenko | G06F 3/044 345/173 |
| 2013/0181942 A1 * | 7/2013 | Bulea | G06F 3/044 345/174 |

OTHER PUBLICATIONS

U.S. Appl. No. 13/248,776: "Single Layer Touch Sensor," Massoud Badaye, filed Sep. 29, 2011; 36 pages.
U.S. Appl. No. 13/405,071: "Single Layer Touch Sensor," Massoud Badaye, filed Feb 14, 2012; 64 pages.
U.S. Appl. No. 13/800,468: "Method and Apparatus for Eliminating Tail Effect in Touch Applications," Vasyl Mandziy, filed Mar. 13, 2013; 51 pages.
U.S. Appl. No. 14/038,423: "Tail Effect Correction for Slim Pattern Touch Panels," Petro Ksondzyk, filed Sep. 26, 2013; 74 pages.
International Search Report for International Application No. PCT/US11/53916 dated Apr. 10, 2012; 3 pages.
International Search Report for International Application No. PCT/US12/26634 dated May 29, 2012; 2 pages.
International Search Report for International Application No. PCT/US13/62331 dated Feb. 12, 2014; 2 pages.
International Search Report for International Application No. PCT/US14/16781 dated May 16, 2014; 2 pages.
USPTO Final Rejection for U.S. Appl. No. 13/918,252 dated Dec. 10, 2013; 16 pages.
USPTO Non-Final Rejection for U.S. Appl. No. 13/528,644 dated Nov. 20, 2012; 6 pages.
USPTO Non-Final Rejection for U.S. Appl. No. 13/800,468 dated Jan. 21, 2014; 8 pages.
USPTO Non-Final Rejection for U.S. Appl. No. 13/918,252 dated Sep. 20, 2013; 12 pages.
USPTO Non-Final Rejection for U.S. Appl. No. 14/038,423 dated Jan. 14, 2014; 9 pages.
USPTO Notice of Allowance for U.S. Appl. No. 13/528,644 dated Jan. 25, 2013; 5 pages.
USPTO Notice of Allowance for U.S. Appl. No. 13/528,644 dated Apr. 23, 2013; 6 pages.
USPTO Notice of Allowance for U.S. Appl. No. 13/528,644 dated Jun. 7, 2013; 6 pages.
USPTO Notice of Allowance for U.S. Appl. No. 13/918,252 dated Feb. 6, 2014; 8 pages.
USPTO Notice of Allowance for U.S. Appl. No. 13/918,252 dated Mar. 25, 2014; 8 pages.
USPTO Requirement to Restriction for U.S. Appl. No. 13/405,071 dated Sep. 13, 2013; 5 pages.
USPTO Requirement to Restriction for U.S. Appl. No. 13/528,644 dated Aug. 21, 2012; 6 pages.
Written Opinion of the International Searching Authority for International Application No. PCT/US11/53916 dated Apr. 10, 2012; 5 pages.
Written Opinion of the International Searching Authority for International Application No. PCT/US12/26634 mailed May 29, 2012; 5 pages.
Written Opinion of the International Searching Authority for International Application No. PCT/US13/ 62331 dated Feb. 12, 2014; 4 pages.
Written Opinion of the International Searching Authority for International Application No. PCT/US14/16781 mailed May 16, 2014; 6 pages.

* cited by examiner

FLIPPED CELL SENSOR PATTERN

RELATED APPLICATIONS

This application is a continuation of U.S. patent application Ser. No. 13/918,252, filed Jun. 14, 2013, which claims priority to U.S. Provisional Application No. 61/776,405, filed on Mar. 11, 2013, all of which are incorporated by reference herein in their entirety.

TECHNICAL FIELD

This disclosure relates to the field of touch-sensors and, in particular, to capacitive touch-sensor arrays.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor electrodes that detect the position of one or more conductive objects, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

Another user interface device that has become more common is a touch screen. Touch screens, also known as touchscreens, touch windows, touch panels, or touchscreen panels, are transparent display overlays which are typically either pressure-sensitive (resistive or piezoelectric), electrically-sensitive (capacitive), acoustically-sensitive (surface acoustic wave (SAW)) or photo-sensitive (infra-red). The effect of such overlays allows a display to be used as an input device, removing the keyboard and/or the mouse as the primary input device for interacting with the display's content. Such displays can be attached to computers or, as terminals, to networks. Touch screens have become familiar in retail settings, on point-of-sale systems, on ATMs, on mobile handsets, on kiosks, on game consoles, and on PDAs where a stylus is sometimes used to manipulate the graphical user interface (GUI) and to enter data. A user can touch a touch screen or a touch-sensor pad to manipulate data. For example, a user can apply a single touch, by using a finger to touch the surface of a touch screen, to select an item from a menu.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

In one embodiment, a capacitance sensor coupled with a capacitive sensor array as described above may be used to scan the capacitive sensor array by measuring the self capacitances associated with each sensor electrode, or the mutual capacitances between pairs of sensor electrodes. The capacitance sensor may then transmit the measured capacitance values to a host, where the capacitance values may be further processed to determine, for example, locations of fingers or other conductive objects near or touching the surface of the capacitive sensor array. In one embodiment, the host compensates for the capacitance differences between the regions having different patterns of conductive traces.

Figure 1:
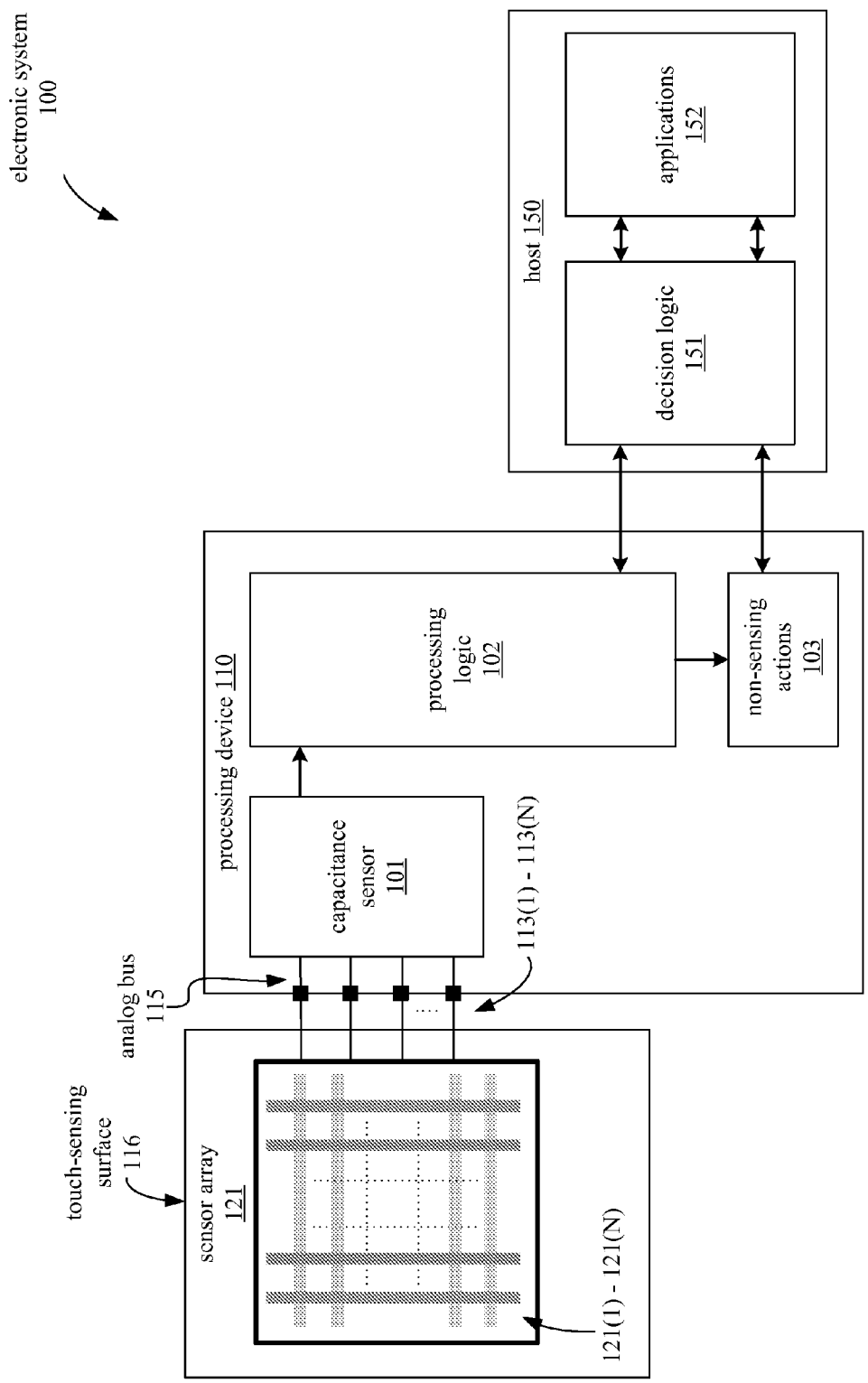
FIG. 1 is a block diagram illustrating an embodiment of an electronic system that processes touch sensor data.

FIG. 1 illustrates a block diagram of one embodiment of an electronic system 100 including a processing device 110 that may be configured to measure capacitances from a touch sensing surface 116 including a capacitive sensor array as described above. The electronic system 100 includes a touch-sensing surface 116 (e.g., a touchscreen, or a touch pad) coupled to the processing device 110 and a host 150. In one embodiment, the touch-sensing surface 116 is a two-dimensional user interface that uses a sensor array 121 to detect touches on the surface 116.

In one embodiment, the sensor array 121 includes sensor electrodes 121(1)-121(N) (where N is a positive integer) that are disposed as a two-dimensional matrix (also referred to as an XY matrix). The sensor array 121 is coupled to pins 113(1)-113(N) of the processing device 110 via one or more analog buses 115 transporting multiple signals. In this embodiment, each sensor electrode 121(1)-121(N) is represented as a capacitor.

In one embodiment, the capacitance sensor 101 may include a relaxation oscillator or other means to convert a capacitance into a measured value. The capacitance sensor 101 may also include a counter or timer to measure the oscillator output. The processing device 110 may further include software components to convert the count value (e.g., capacitance value) into a sensor electrode detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance sensor 101 may be evaluating other measurements to determine the user interaction. For example, in the capacitance sensor 101 having a sigma-delta modulator, the capacitance sensor 101 is evaluating the ratio of pulse widths of the output, instead of the raw counts being over or under a certain threshold.

In one embodiment, the processing device 110 further includes processing logic 102. Operations of the processing logic 102 may be implemented in firmware; alternatively, it may be implemented in hardware or software. The processing logic 102 may receive signals from the capacitance sensor 101, and determine the state of the sensor array 121, such as whether an object (e.g., a finger) is detected on or in proximity to the sensor array 121 (e.g., determining the presence of the object), where the object is detected on the sensor array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sensor array 121 (e.g., keyboard, keypad, mouse, trackball, LEDs, displays, or other peripheral devices).

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC™) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

In one embodiment, the electronic system 100 is implemented in a device that includes the touch-sensing surface 116 as the user interface, such as handheld electronics, portable telephones, cellular telephones, notebook computers, personal computers, personal data assistants (PDAs), kiosks, keyboards, televisions, remote controls, monitors, handheld multi-media devices, handheld video players, gaming devices, control panels of a household or industrial appliances, or other computer peripheral or input devices. Alternatively, the electronic system 100 may be used in other types of devices. It should be noted that the components of electronic system 100 may include all the components described above. Alternatively, electronic system 100 may include only some of the components described above, or include additional components not listed herein.

Figure 2:
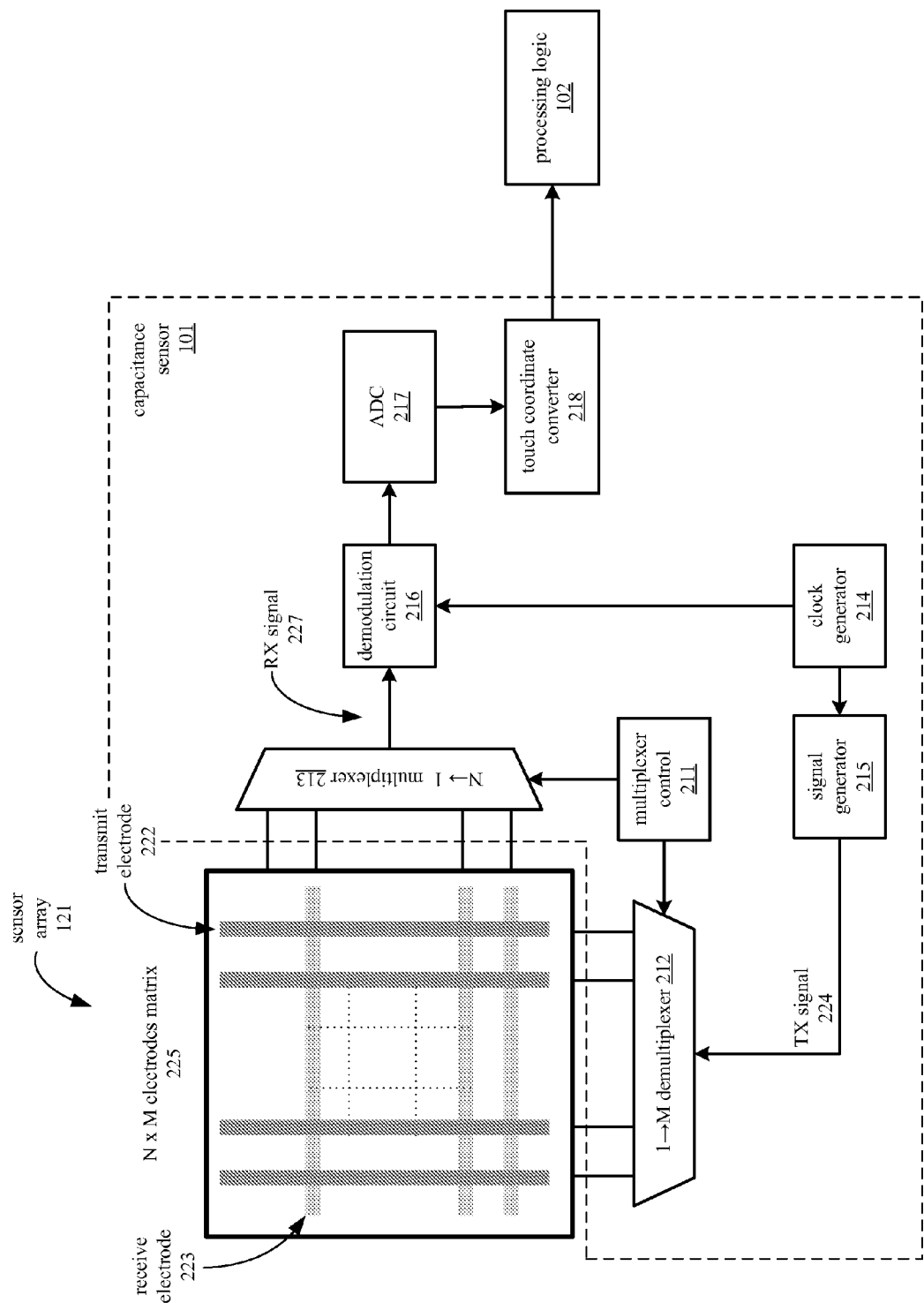
FIG. 2 is a block diagram illustrating an embodiment of an electronic system that processes touch sensor data.

FIG. 2 is a block diagram illustrating one embodiment of a capacitive touch sensor array 121 and a capacitance sensor 101 that converts changes in measured capacitances to coordinates indicating the presence and location of touch. The coordinates are calculated based on changes in measured capacitances relative to the capacitances of the same touch sensor array 121 in an un-touched state. In one embodiment, sensor array 121 and capacitance sensor 101 are implemented in a system such as electronic system 100. Sensor array 220 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 201 through demultiplexer 212 and multiplexer 213.

Capacitance sensor 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 may be implemented in the processing logic 102.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sensor 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different.

The output of signal generator 215 is connected with demultiplexer 212, which allows the TX signal 224 to be applied to any of the M transmit electrodes of touch sensor 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied. In an alternate embodiment the TX signal 224 may be presented in a true form to a subset of the transmit electrodes 222 and in complement form to a second subset of the transmit electrodes 222, wherein there is no overlap in members of the first and second subset of transmit electrodes 222.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with each intersection between a TX electrode and an RX electrode can be sensed by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When an object, such as a finger, approaches the electrode matrix 225, the object causes a change in the measured mutual capacitance between only some of the electrodes. For example, if a finger is placed near the intersection of transmit electrode 222 and receive electrode 223, the presence of the finger will decrease the charge coupled between electrodes 222 and 223. Thus, the location of the finger on the touchpad can be determined by identifying the one or more receive electrodes having a decrease in measured mutual capacitance in addition to identifying the transmit electrode to which the TX signal 224 was applied at the time the decrease in capacitance was measured on the one or more receive electrodes.

By determining the mutual capacitances associated with each intersection of electrodes in the matrix 225, the presence and locations of one or more conductive objects may be determined. The determination may be sequential, in parallel, or may occur more frequently at commonly used electrodes.

In alternative embodiments, other methods for detecting the presence of a finger or other conductive object may be used where the finger or conductive object causes an increase in measured capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined based on the locations of one or more electrodes at which a change in measured capacitance is detected.

The induced current signal 227 is integrated by demodulation circuit 216. The rectified current output by demodulation circuit 216 can then be filtered and converted to a digital code by ADC 217.

A series of such digital codes measured from adjacent sensor or intersections may be converted to touch coordinates indicating a position of an input on touch sensor array 121 by touch coordinate converter 218. The touch coordinates may then be used to detect gestures or perform other functions by the processing logic 102.

In one embodiment, the capacitance sensor 101 can be configured to detect multiple touches. One technique for the detection and location resolution of multiple touches uses a two-axis implementation: one axis to support rows and another axis to support columns. Additional axes, such as a diagonal axis, implemented on the surface using additional layers, can allow resolution of additional touches.

Figure 3A:
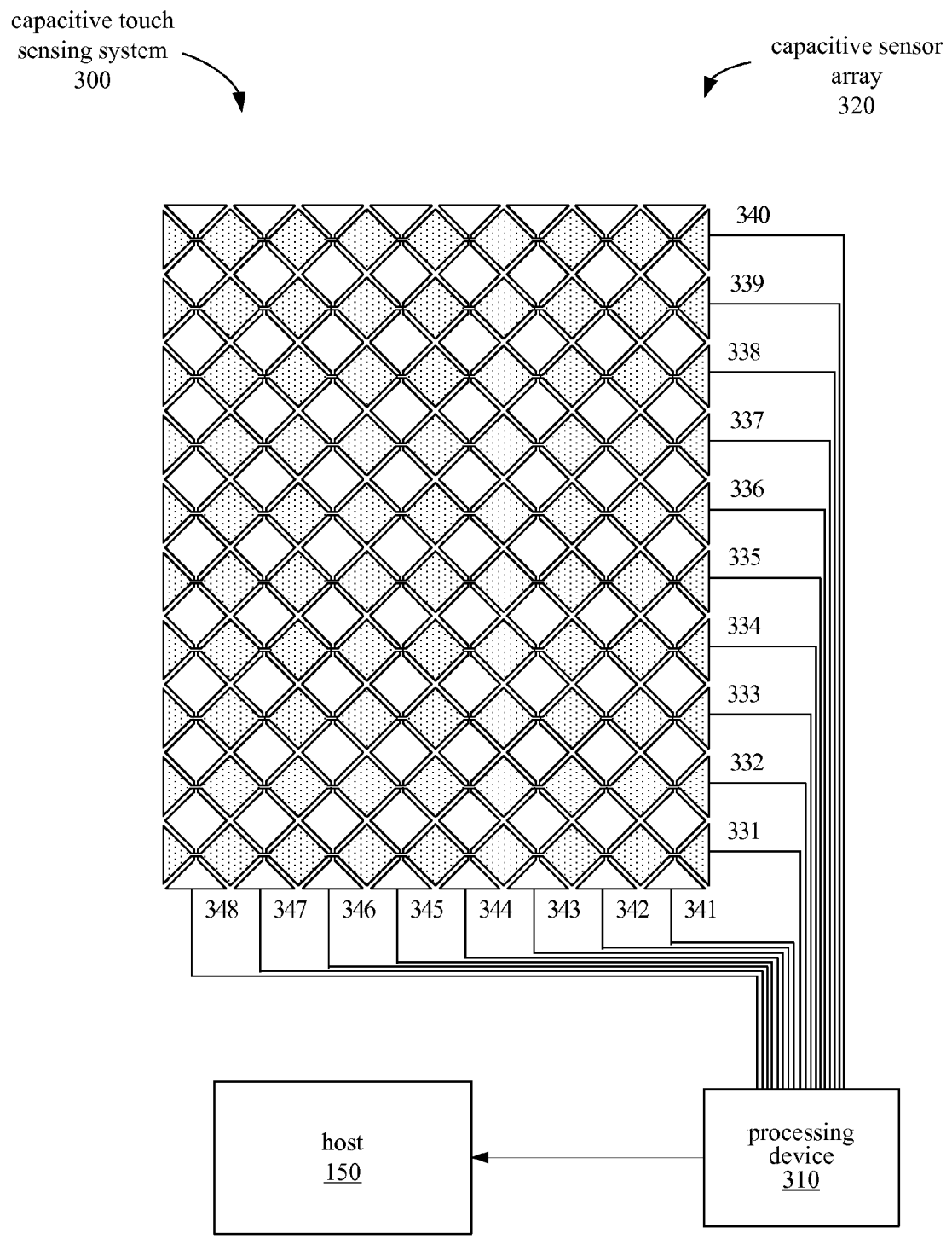
FIG. 3A illustrates an embodiment of an electronic touch-sensing system using a dual solid diamond capacitive sensor pattern.

FIG. 3A illustrates an embodiment of a capacitive touch sensing system 300 that includes a capacitive sensor array 320. Capacitive sensor array 320 includes a plurality of row sensor electrodes 331-340 and a plurality of column sensor electrodes 341-348. The row and column sensor electrodes 331-348 are connected to a processing device 310, which may include the functionality of capacitance sensor 101, as illustrated in FIG. 2. In one embodiment, the processing device 310 may perform TX-RX scans of the capacitive sensor array 320 to measure a mutual capacitance value associated with each of the intersections between a row sensor electrode and a column sensor electrode in the sensor array 320. The measured capacitances may be further processed to determine higher resolution locations of one or more contacts at the capacitive sensor array 320.

In one embodiment, the processing device 310 is connected to a host 150 which may receive the measured capacitances or calculate high precision locations from the processing device 310.

Figure 3B:
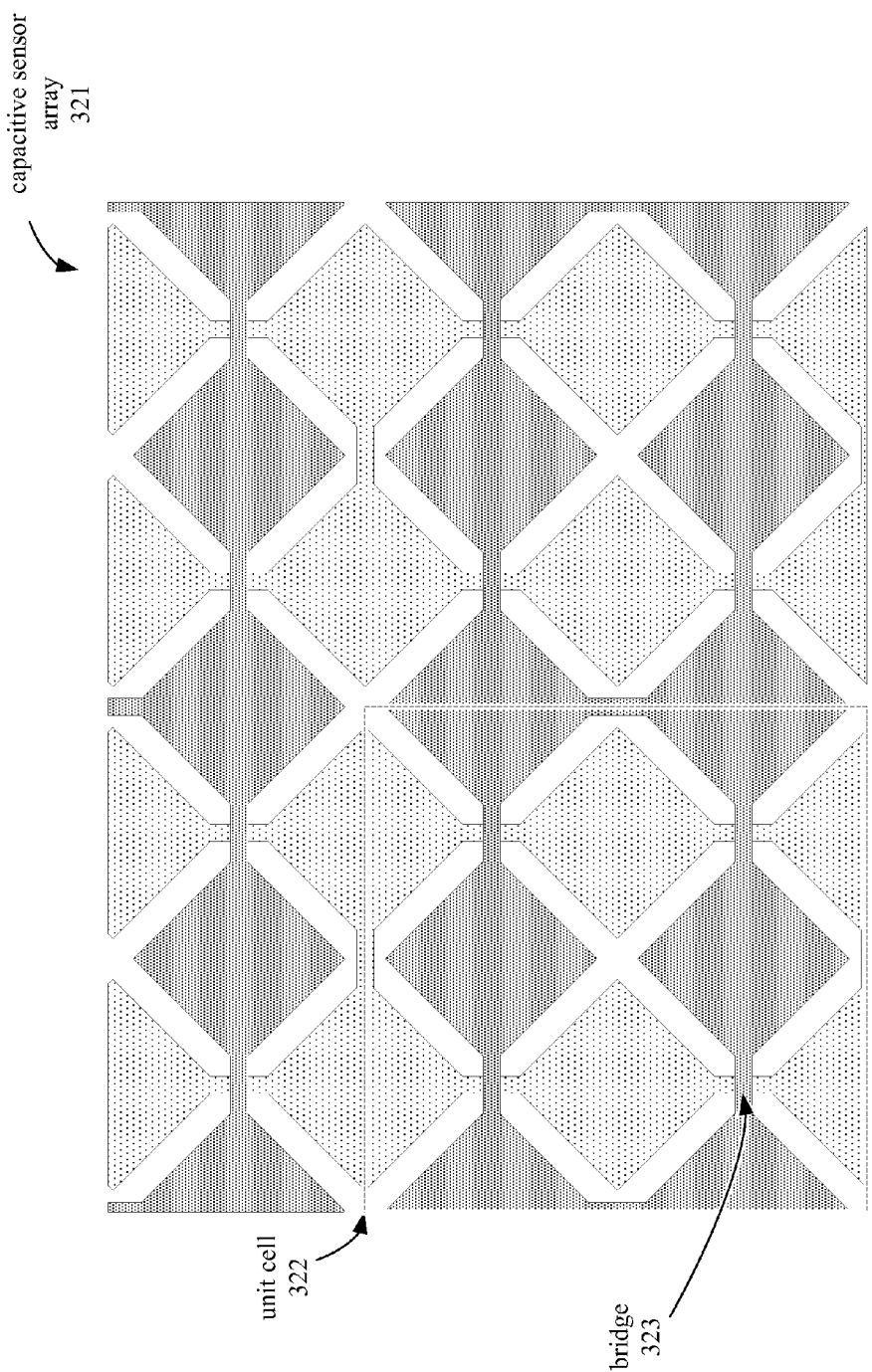
FIG. 3B illustrates an embodiment of a dual solid diamond capacitive sensor pattern.

The sensor array 320 illustrated in FIG. 3A includes sensor electrodes arranged in a diamond pattern. Specifically, the sensor electrodes 331-348 of sensor array 320 are arranged in a single solid diamond (SSD) pattern. FIG. 3B illustrates a capacitive sensor array 321 having an alternate embodiment of the diamond pattern, which is the dual solid diamond (DSD) pattern. Each of the sensor electrodes of capacitive sensor array 321 includes two rows or columns of electrically connected diamond shaped traces. Relative to the SSD pattern, the DSD pattern has improved signal disparity characteristics due to an increase in the coupling between TX and RX sensor electrodes while maintaining the same self-capacitance coupling possible between each sensor electrode and a conductive object near the sensor electrode. The DSD pattern may also provide higher sensitivity for tracking smaller objects, such as the point of a stylus, as compared to patterns having larger features, such as SSD. However, the DSD pattern also increases the number of bridges (such as bridge 323) used to create the pattern, which may result in decreased manufacturing yield. The increased number of bridges may also be visible if metal bridges are used. For example, sensor array 321 includes four bridges within unit cell 322.

Figure 4A:
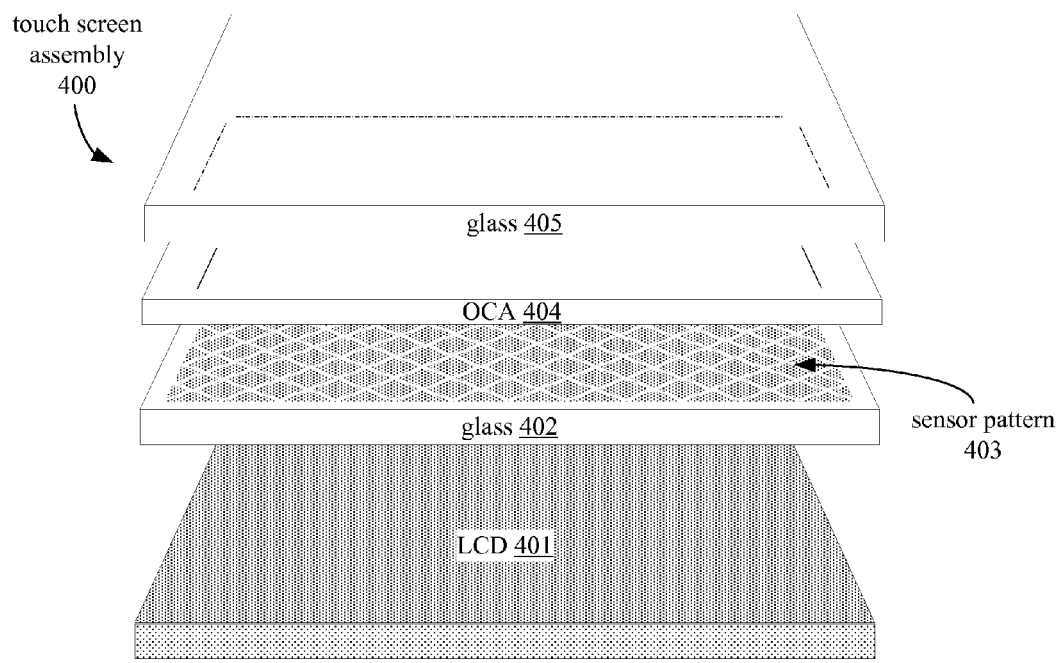
FIGS. 4A and 4B illustrate embodiments of touch screen assemblies.
Figure 4B:
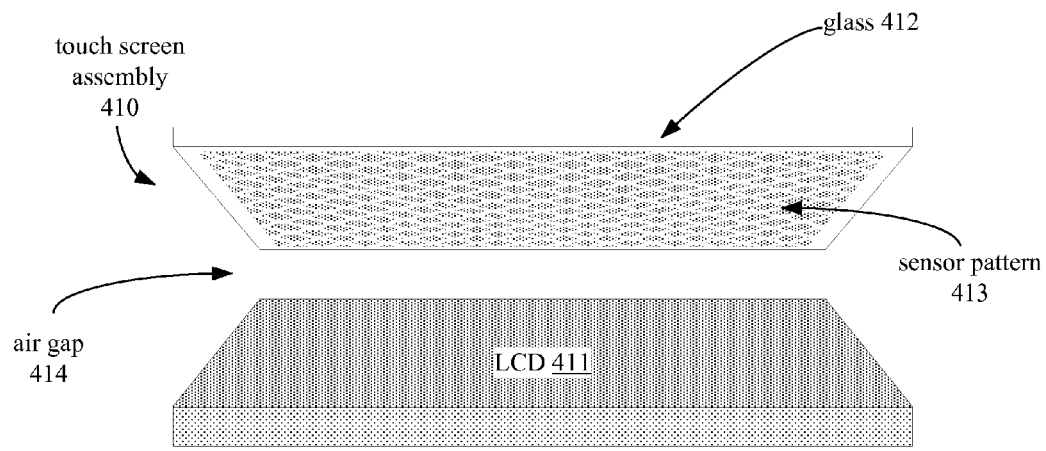

FIGS. 4A and 4B illustrate embodiments of touch screen assemblies 400 and 410, respectively, that include capacitive sensor arrays. Touch screen assembly 400 includes a liquid crystal display (LCD) 401 over which glass 402 is laid. A sensor pattern 403 is constructed on the surface of glass 402. In one embodiment, the sensor pattern 403 is constructed on the surface of glass 402 that faces away from the LCD 401. Optically clear adhesive (OCA) 404 may be used to bond glass 405 to the surface of glass 402 on which the sensor pattern 403 is constructed, thus protecting the sensor pattern 403. The sensor pattern 403 may be a SSD pattern, a DSD pattern, or another pattern as described in the following figures.

Touch screen assembly 410 includes an LCD 411, over which a glass 412 may be positioned. In one embodiment, sensor pattern 413 may be constructed on the surface of glass 412 that faces the LCD 411. In one embodiment, an air gap 414 may separate the glass 412 from the LCD 411.

In one embodiment, a capacitive sensor pattern such as the SSD pattern, DSD pattern, or other capacitive sensor pattern described herein may include row and column sensor electrodes that can be expressed as a matrix of the intersections between the row and column electrodes. Resolution of these sensor arrays may be represented as the product of the number of columns and the number of rows. For example, for a sensor array with N row electrodes and M column electrodes, the number of intersections would be N×M.

Figure 5:
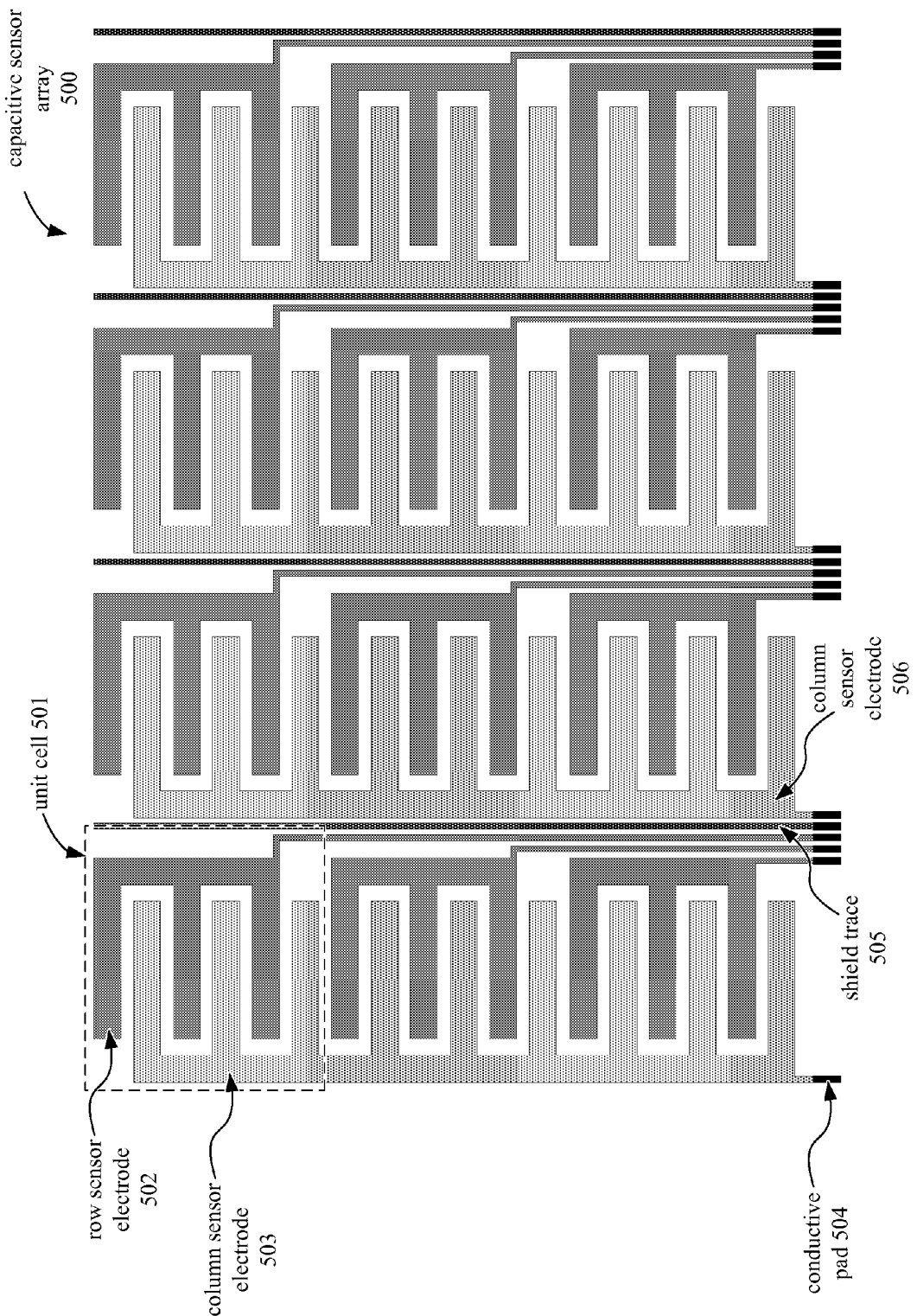
FIG. 5 illustrates an embodiment of a capacitive sensor array.

FIG. 5 illustrates an embodiment of a capacitive sensor array 500 that includes multiple column sensor electrodes and multiple row sensor electrodes constructed from a single layer of conductive material. For a single-layer sensor array pattern, the pattern may include a single layer of copper, indium-tin oxide (ITO), or other conductive material without any overlapping portions. In one embodiment, such a single layer of conductive material may include different types of conductive materials. For example, part of the single layer may be constructed from ITO while another part may be constructed from copper. In one embodiment, the single layer of conductive material may lie substantially on a single plane or surface such that the components of the sensor pattern are substantially coplanar. For example, the single layer of conductive material may conform to the surface of a substrate such as glass or plastic.

In one embodiment, the active sensing region over which changes in capacitance may be detected is divisible into a grid of unit cells, such as unit cell 501. Each of these unit cells may contain a sensing region corresponding to a particular pairing between a row sensor electrode and a column sensor electrode. For example, the unit cell 501 contains the sensing region between row sensor electrode 502 and column sensor electrode 503. In other words, the presence of a conductive object within unit cell 501 influences the mutual capacitance between row sensor electrode 502 and column sensor electrode 503 more than the presence of the conductive object influences any mutual capacitance between any other pair of row and column sensor electrodes.

In one embodiment, shield traces such as shield trace 505 may be included in the capacitive sensor array 500 to reduce crosstalk between certain row and column sensor electrode pairs. For example, shield trace 505 is located between a routing trace of row sensor electrode 502 and column sensor electrode 506 to reduce capacitive coupling between the electrodes 502 and 506.

In one embodiment, each of the row sensor electrodes and column sensor electrodes in the sensor array 500 may be electrically connected to a conductive pad outside the active sensing region of the sensor array 500. For example, column sensor electrode 503 is electrically connected to a conductive pad 504. In one embodiment, such conductive pads may be used to further connect the sensor array 500 to a capacitance sensor 101 so that the capacitance sensor 101 may measure capacitances between the row and column sensor electrodes.

In one embodiment, the number of conductive pads for the sensor and shield traces in the sensor array pattern of sensor array 500 may be determined as $Nz=Tx+Tx(Rx+1)$, where Nz is the number of conductive pads, Tx is the number of column sensor electrodes, and Rx is the number of row sensor electrodes. Thus, for a sensor array having three rows and four columns of unit cells, as illustrated in FIG. 5, the number Nz of conductive pads is 4+4(3+1), or 20 conductive pads. By a similar calculation, a sensor array having 18 rows and 10 columns would have 200 conductive pads.

Figure 6A:
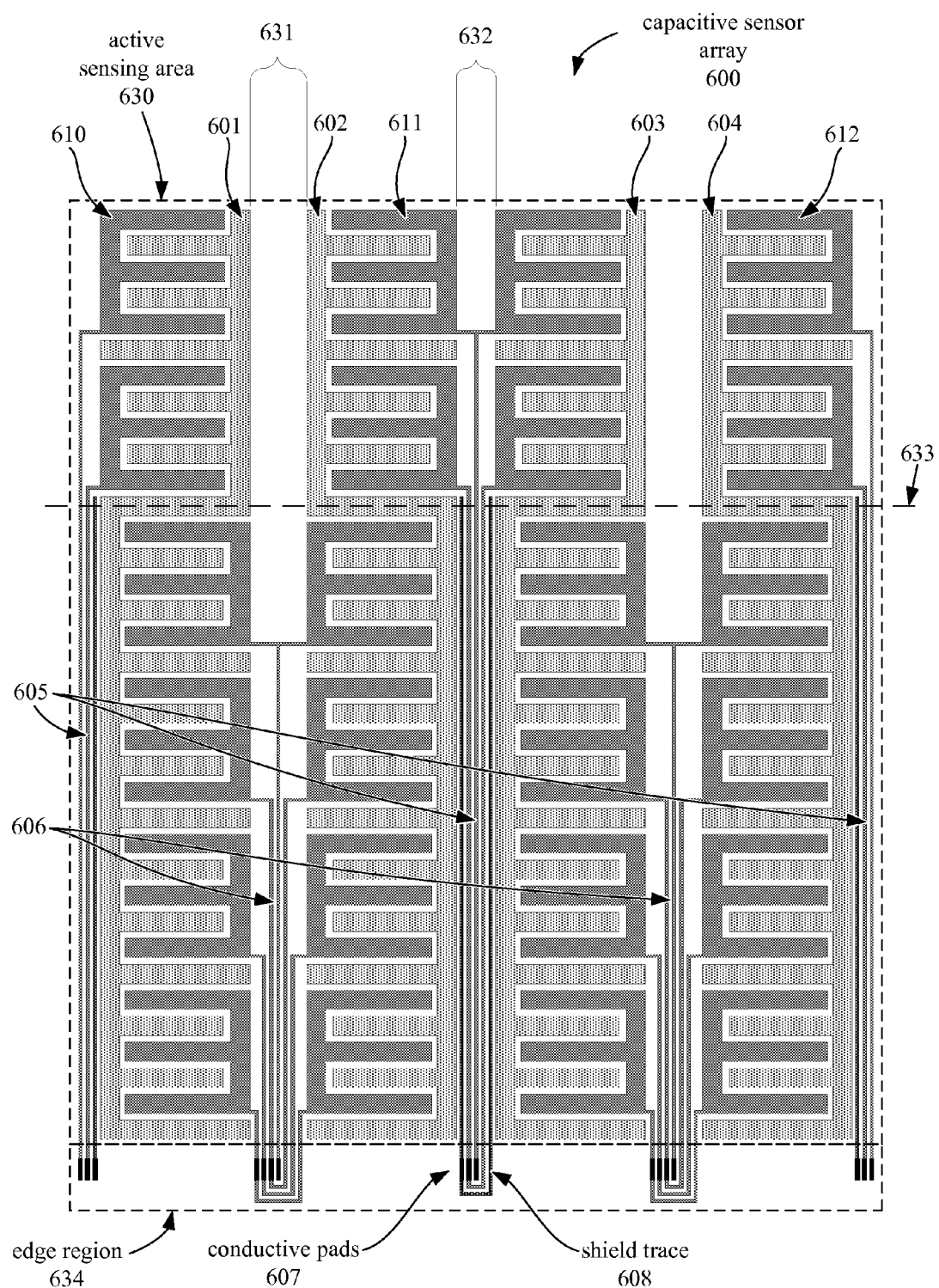
FIG. 6A illustrates an embodiment of a capacitive sensor array.

FIG. 6A illustrates an embodiment of a capacitive sensor array 600. In one embodiment, capacitive sensor array 600 may be coupled with a capacitance sensor such as capacitance sensor 101. For example, each of the sensor electrodes of the sensor array 600 may be electrically connected to capacitance sensor 101 via an analog bus 115 so that the capacitance sensor 101 can sense mutual capacitances between the small row sensor electrodes and the large column sensor electrodes of the sensor array 600.

In one embodiment, the capacitive sensor array 600 may include a set of large sensor electrodes 601, 602, 603, and 604 which may be used as column sensor electrodes. In one embodiment, the capacitive sensor array 600 may include a set of small sensor electrodes, such as sensor electrodes 610-612, each of which is smaller (in area or mass, for example) than any of the large sensor electrodes. The small sensor electrodes may be used as row sensor electrodes. In one embodiment, the large sensor electrodes and small sensor electrodes may be formed from a single layer of conductive material.

In one embodiment, each of the small sensor electrodes in the same row may be sensed independently from other small sensor electrodes in the same row; alternatively, the small sensor electrodes in the same row may be electrically coupled and sensed together. For example, the small sensor electrodes 610-612 may be sensed separately from one another, or they may be coupled together and treated as a single electrode by the capacitance sensor 101 during the sensing scan.

In one embodiment, the active sensing area 630 of the capacitive sensor array 600 includes the area of the sensor array within which the presence of a conductive object may be detected by mutual capacitance or self-capacitance scanning. In one embodiment, the active sensing area 630 may be divisible into a grid of N×M unit cells each corresponding to a sensing region between one of the large sensor electrodes and one of the small sensor electrodes.

In one embodiment, each of the sensor electrodes and shield traces in the sensor array 600 may be electrically connected to their own respective conductive pads, such as pads 607, located within an edge region 634 of the sensor array 600. As illustrated in FIG. 6A, the shield trace 608 and small sensor electrode 611 are each connected to one of the conductive pads 607, for example. In one embodiment, each of the sensor electrodes may be electrically connected to their respective conductive pads by one or more routing traces. Some sensor electrodes may include, for example, two or more subelements each connected to a single conductive pad; thus, the single conductive pad may be connected to more than one routing trace. In one embodiment, the edge region 634 in which the conductive pads are located is outside the active sensing area 630 of the capacitive sensor array.

In one embodiment, the area of the capacitive sensor array 600 may include one or more routing channels, such as routing channels 631 and 632. In one embodiment, row sensor electrodes may include one or more subelements connected to routing traces that extend through one of the routing channels to an edge region 634. In one embodiment, row subelements that are on one side of a dividing line 633 may be connected to routing traces located in different routing channels than routing traces connected to subelements that are on the other side of the dividing line 633. For example, subelements that are located below dividing line 633 may be routed to the edge region 634 via routing traces 606, which are located in different routing channels than the routing traces 605 that connect subelements above the dividing line 633 to the edge region 634.

In one embodiment, each unit cell contains a substantially similar pattern of conductive material forming the sensor electrodes within the unit cell. In one embodiment, the pattern within a unit cell on one side of the dividing line 633 may be reversed, or flipped, relative to a pattern within a unit cell on another side of the dividing line 633.

In one embodiment, the dividing line 633 may be located so that ⅔ of the subelements of the small sensor electrodes are on one side of the dividing line 633 and ⅓ of the subelements of the small sensor electrodes are on the other side of the dividing line 633. In alternate embodiments, the dividing line 633 may divide the subelements according to different ratios; for example, the dividing line may be positioned so that half of the subelements of the small sensor electrodes are above the dividing line and half are below.

In one embodiment, the position of the dividing line 633 may be selected in order to balance the widths of the routing channels and the resistance of the small sensor elements. For example, with reference to FIG. 6A, the small sensor electrodes that are above the dividing line 633 are connected to routing traces 605 that are longer than the routing traces 606 of the small sensor electrodes below the dividing line 633. Thus, the widths of each of the longer routing traces 605 may be greater than the widths of each of the shorter routing traces 606 to minimize the difference in resistance between the sensor electrodes on either side of the dividing line 633. Accordingly, in one embodiment, the position of dividing line 633 may be chosen so that the routing channel 632 may contain fewer routing traces 605 as compared to routing channel 631, in order to minimize the difference between the widths of the routing channels 631 and 632.

In one embodiment, the capacitive sensor array 600 may include one or more shield traces, which may be grounded to reduce cross-talk between TX and RX sensor electrodes. For example, in an embodiment where the large sensor electrodes are used as TX sensor electrodes and the small sensor electrodes are used as RX sensor electrodes, a shield trace may be located in between certain portions of the small sensor electrodes and the large sensor electrodes. As illustrated in FIG. 6A, the shield trace 608, for example, is located between the routing traces in routing channel 632 and the large sensor electrodes surrounding routing channel 632, thus reducing the cross talk between the large sensor electrodes and the routing traces.

In one embodiment, the length of each of the shield traces may be less than the length of the sensor array 600 such that the shield traces do not extend completely from one edge of the sensor array 600 to the opposite edge. In one embodiment, the length of the shield traces may depend on the position of the dividing line 633. For example, the shield traces may extend from an edge region 634 to the dividing line 633.

Figure 6B:
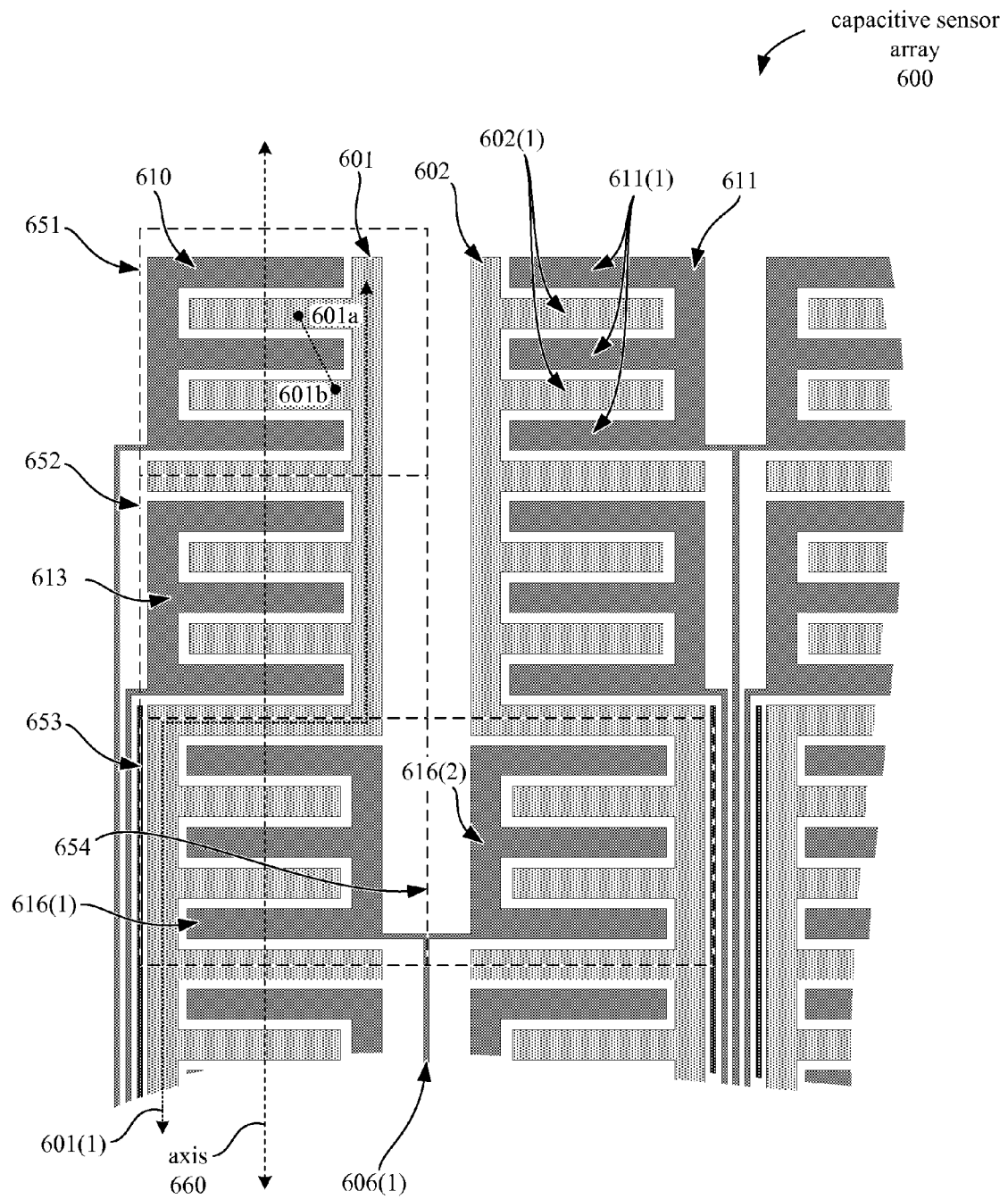
FIG. 6B is a detail illustration of a capacitive sensor array, according to an embodiment.

FIG. 6B illustrates a portion of the capacitive sensor array 600, including unit cells 651, 652, 653, and 654, among others. Unit cell 651 includes the sensing region between sensor electrodes 610 and 601. Unit cell 652 includes the sensing region between sensor electrodes 613 and 601. Unit cell 653 includes the sensing region between sensor electrodes 616 and 601. Unit cell 654 includes the sensing region between sensor electrodes 616 and 602. Sensor electrode 616 includes subelements 616(1) and 616(2) which are electrically connected together by a routing trace 606(1). Routing trace 606(1) is one of the routing traces 606 that extends to the edge region 634, as illustrated in FIG. 6A.

In one embodiment, two or more of the small sensor electrodes in the same column of unit cells may be located on the same lateral side of the large column sensor electrode. For example, the small sensor electrodes 610 and 613 in adjacent unit cells in the same column are both located on the left side of the large sensor electrode 601. In one embodiment, these sensor electrodes 610 and 613 are consecutive in a spatial order of the small sensor electrodes along a longitudinal axis 660 of the large sensor electrode 601. Specifically, the small sensor electrodes 610, 613, and 616 are first, second, and third in order from top to bottom along the axis 660; thus, the sensor electrodes 610 and 613 are consecutive in order and are also located on the same lateral side of the large sensor electrode 601.

The sensor electrodes 610 and 613 are also located on an opposite lateral side of the large sensor electrode 601 from the small sensor electrode 616 in unit cell 653, which is in the same column of unit cells as unit cells 651 and 652. While sensor electrodes 610 and 613 are on the left side of sensor electrode 601, the sensor electrode 616 is on the right side of sensor electrode 601.

In one embodiment, a portion of each of the small sensor electrodes may be located between two interior points of an adjacent large sensor electrode. For example, points 601a and 601b lie within the interior of the shape of sensor electrode 601 such that a line segment between points 601a and 601b pass through a portion of the small sensor electrode 610. Thus, this portion of sensor electrode 610 lies between the interior points 601a and 601b. In one embodiment, at least one pair of such interior points may be chosen for each small sensor electrode so that a line segment between the interior points would cross a portion of the small sensor electrode.

In one embodiment, each of the large column sensor electrodes may have a main trace extending from a first end of the sensor electrode to an opposite end of the sensor electrode. For example, the large sensor electrode 601 includes a main trace 601(1) that extends from one end of the electrode 601 to the other end of electrode 601. In one embodiment, for three small sensor electrode in the same column of unit cells, a first small sensor electrode may be located on the same lateral side of a main trace of a large sensor electrode as a second small sensor electrode in an adjacent unit cell, while the first small sensor electrode is located on the opposite side of the main trace from a third small sensor electrode.

For example, the small sensor electrodes 610, 613, and 616 are all located within the same column of unit cells including unit cells 651, 652, and 653. Small sensor electrodes 610 and 613 are both located on the left side of the main trace 601(1) of large sensor electrode 601. Each of the small sensor electrodes 610 and 613 are also located on the opposite side of the main trace 601(1) from the small sensor electrode 616, which is located on the right side of the main trace 601(1).

In one embodiment, one or more of the small sensor electrodes may include multiple subelements electrically coupled together by one or more routing traces. For example, the small sensor electrode 616 may include two subelements 616(1) and 616(2) that are connected together by routing trace 606(1). In one embodiment, the subelements may be located in adjacent unit cells. For example, subelement 616(1) is located within unit cell 653, while subelement 616(2) is located within unit cell 654, which is adjacent to unit cell 653 and in a different column from unit cell 653.

In one embodiment, subelements of a small sensor electrode may be located on facing lateral sides of the main traces of two large column electrodes. For example, the subelement 616(1) is located on the right side of the main trace 601(1) of large sensor electrode 601, while subelement 616(2) is located on the left side of the main trace of the large sensor element 602, which is facing the right side of main trace 601(1). According to this arrangement, the subelements in a given routing channel that are the farthest from the edge region may share a single routing trace, such as routing trace 606(1), that extends to the edge region in order to reduce the width of the routing channel.

In one embodiment, each of the small subelements may include a number of subtraces that are interleaved with subtraces of a large sensor electrode within a unit cell. For example, the small sensor electrode 611 includes subtraces 611(1) that are interleaved with subtraces 602(1) of the large sensor electrode 602. Similarly, each of the subelements making up the small sensor electrodes 610, 613, and 616 have subtraces that are interleaved with subtraces of the large sensor electrode 601.

Figure 7A:
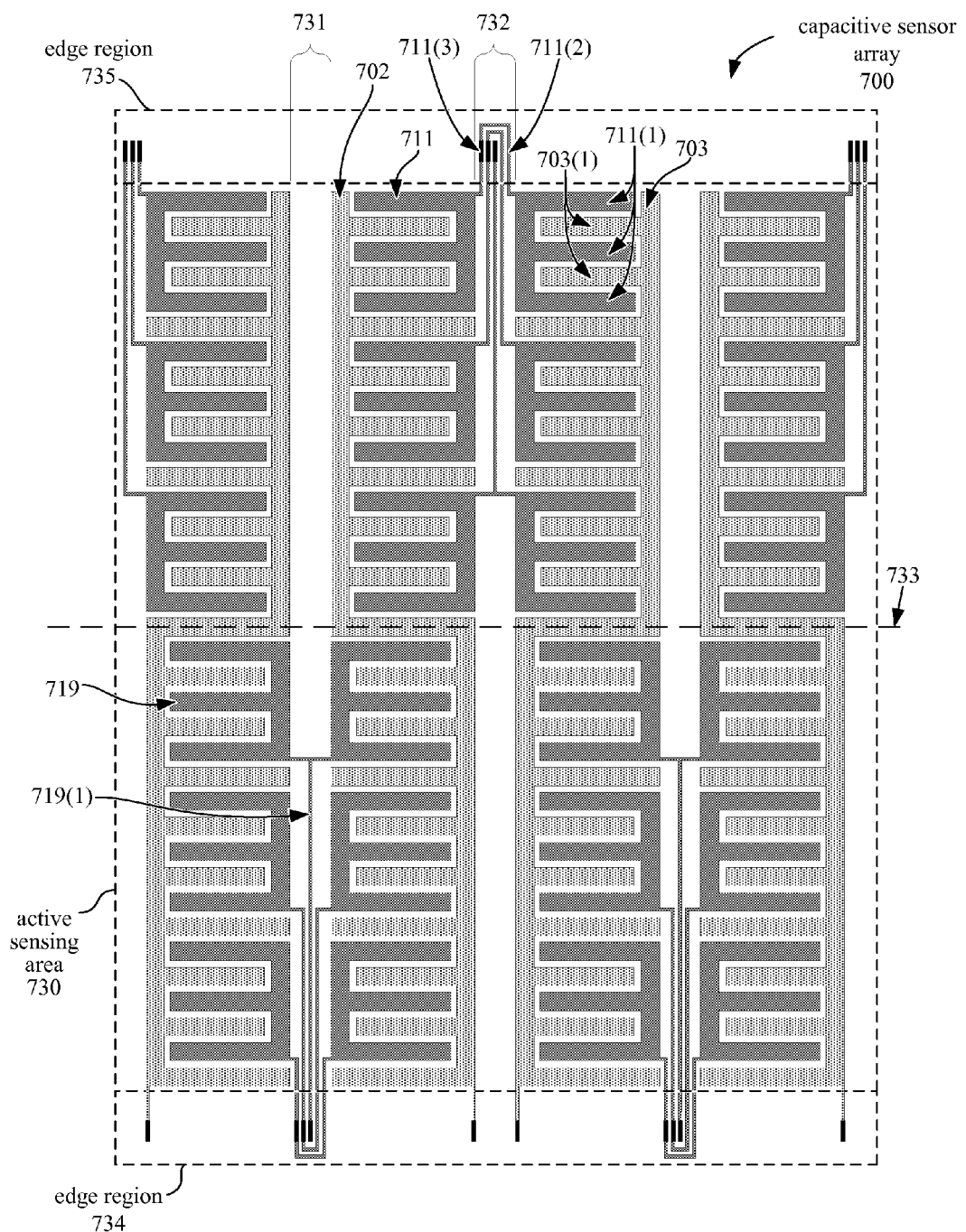
FIG. 7A illustrates an embodiment of a capacitive sensor array.

FIG. 7A illustrates an embodiment of a capacitive sensor array 700. Like the capacitive sensor array 600, sensor array 700 also has a pattern of sensor electrodes formed from a single layer of conductive material where the pattern of conductive material within some unit cells is flipped relative to the pattern in other unit cells. In one embodiment, the capacitive sensor array 700 includes a set of large sensor electrodes and a set of small sensor electrodes, where each of the small sensor electrodes includes at least one subelement having subtraces that are interleaved with subtraces of at least one of the large sensor electrodes. For example, the subtraces 711(1) of the small sensor electrode 711 are interleaved with subtraces 703(1) of the large sensor electrode 703.

In one embodiment, at least a portion of each small sensor electrode is located between portions of a large sensor electrode. In other words, for each small sensor electrode, two interior points within a large sensor electrode may be selected so that a line segment between the interior points crosses part of the small sensor electrode. In the case of sensor electrode 711, portions of the subtraces 711(1) are located in between the subtraces 703(1) of the large sensor electrode 703.

In one embodiment, the pattern of conductive material is similar within each unit cell of the capacitive sensor array 700, except that the pattern of conductive material in some of the unit cells is flipped. In one embodiment, the pattern of conductive material within unit cells above a dividing line 733 may be flipped relative to the pattern of conductive material within unit cells below the dividing line 733.

In one embodiment, the dividing line 733 may be divide the surface of the sensor array 700 into substantially equal parts, so that half of the small sensor electrodes are located on one side of the dividing line 733 and the other half of the small sensor electrodes are located on the other side of the dividing line 733.

In one embodiment, the small sensor electrodes on a given side of the dividing line 733 may be connected via routing traces to conductive pads in an edge region on the same side of the dividing line 733. For example, the small sensor electrode 711 that is above the dividing line 733 is connected via routing trace 711(2) to a conductive pad 711(3) that is in an edge region 735 on the same side of dividing line 733 as the small sensor electrode 711.

Similarly, each of the small sensor electrodes below the dividing line 733 are connected via their respective routing traces to conductive pads in the edge region 734, which is also below the dividing line 733. In one embodiment, the routing traces may be located within routing channels, such as routing channels 731 and 732. In one embodiment, multiple routing traces may share a single conductive pad. For example, conductive pad 711(3) may be connected to two routing traces, one leading to each of the two subelements of sensor electrode 711.

In one embodiment, for each of the small sensor electrodes in the capacitive sensor array 700, the small sensor electrode is electrically connected via one or more routing traces to a conductive pad within the nearest edge region to the small sensor electrode. In one embodiment, the nearest edge region may be the nearest edge region out of a subset of edge regions. For example, between edge regions 734 and 735, edge region 735 is the nearest edge region to the small sensor electrode 711; therefore, the small sensor electrode is connected to conductive pads within edge region 735.

Figure 7B:
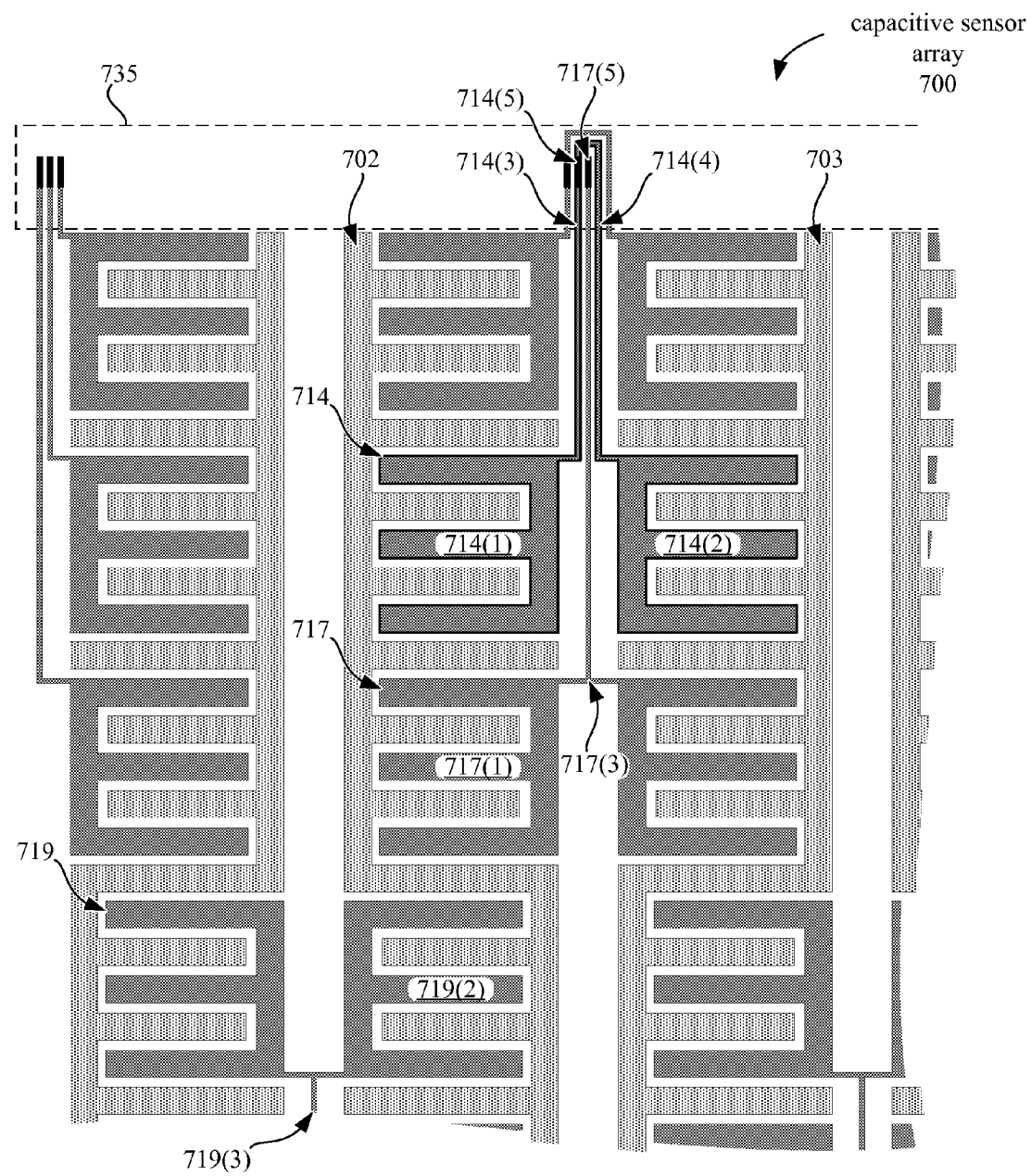
FIG. 7B is a detail illustration of a capacitive sensor array, according to an embodiment.

FIG. 7B illustrates a detailed view of capacitive sensor array 700. In one embodiment, one or more of the small sensor electrodes may include two or more subelements electrically connected together. In one embodiment, these subelements may be connected via one or more routing traces, which may extend from the subelements to an edge region, such as edge region 734 or 735, of the capacitive sensor array 700. For example, small sensor electrode 714 may include two subelements 714(1) and 714(2) that are electrically connected by routing traces 714(3) and 714(4). Routing traces 714(3) and 714(4) extend from the subelements 714(1) and 714(2) to the edge region 735.

In one embodiment, one subelement of a small sensor electrode may be located on a first lateral side of a first large sensor electrode, while a second subelement of the same sensor electrode is on a lateral side of a different large sensor electrode facing the first lateral side of the first large sensor electrode. With reference to FIG. 7B, for example, the subelement 714(1) is on the right side of the large sensor electrode 702, while subelement 714(2) is on the left side of the large sensor electrode 703. The large sensor electrode 703 is in an adjacent column of unit cells such that the left side of electrode 703 faces the right side of sensor electrode 702.

In one embodiment, two small sensor electrodes in adjacent unit cells may each include a subelement connected to a routing trace that extends to a conductive pad in a first edge region, while a third small sensor electrode in the same column of unit cells includes a subelement connected to a routing trace that extends to a conductive pad in a second edge region. In one embodiment, the second edge region is opposite from the first edge region.

For example, small sensor electrode 714 includes a subelement 714(1) connected to a routing trace 714(3) that extends to edge region 735. Small sensor electrode 717 has a subelement 717(1) in an adjacent unit cell in the same column as subelement 714(1). Subelement 717(1) is connected to a routing trace 717(3) that also extends to the edge region 735. Subelement 719(2) of small sensor electrode 719 is connected to a routing trace 719(3) that extends to edge region 734, as illustrated in FIG. 7A. In one embodiment, edge region 734 is opposite from edge region 735.

Figure 8:
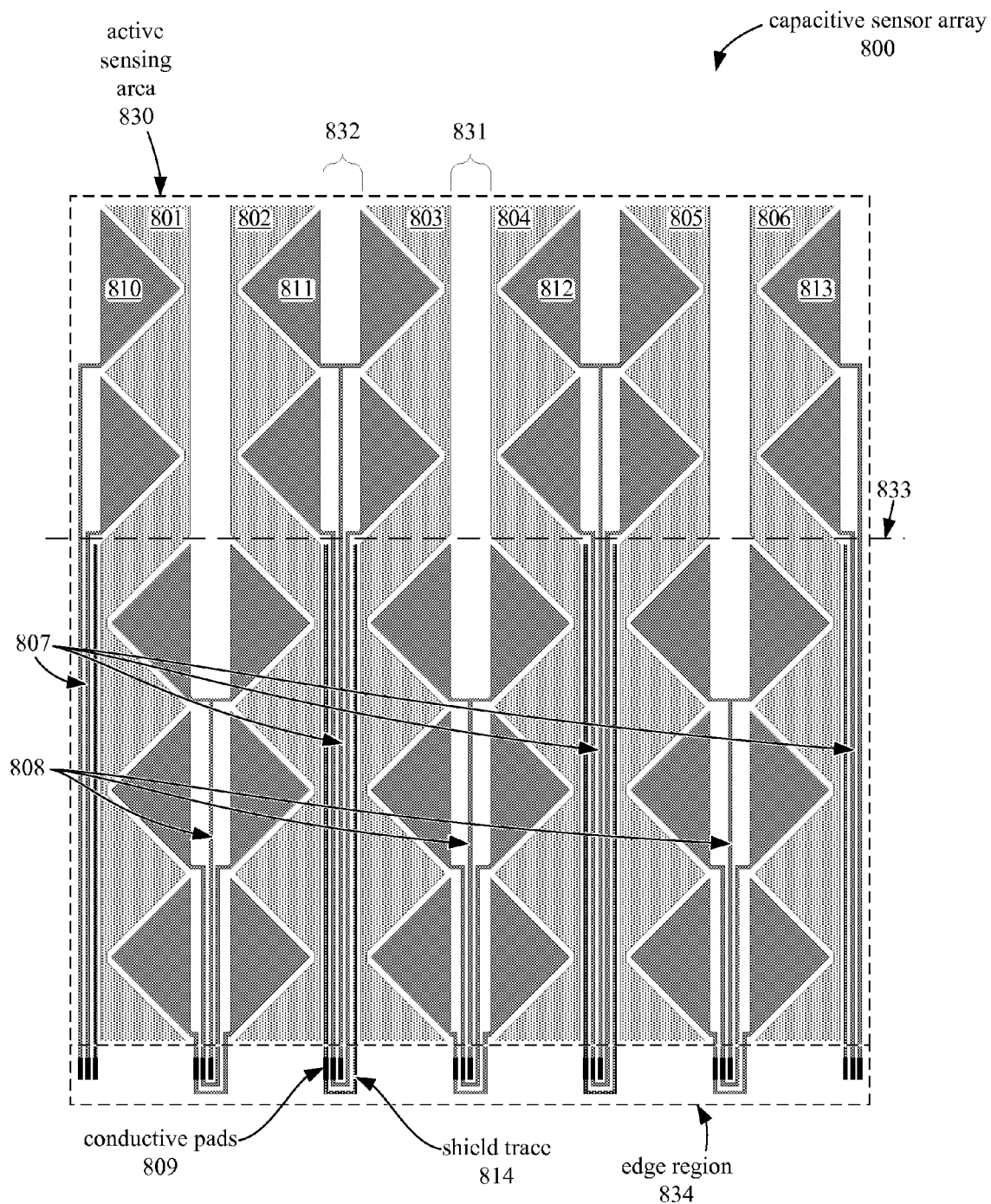
FIG. 8 illustrates an embodiment of a capacitive sensor array.

FIG. 8 illustrates an embodiment of a capacitive sensor array 800 having a reversing diamond pattern, where the diamond shapes are split by routing channels. In one embodiment, capacitive sensor array 800 may be coupled with a capacitance sensor such as capacitance sensor 101. For example, each of the sensor electrodes of the sensor array 800 may be electrically connected to capacitance sensor 101 via an analog bus 115 so that the capacitance sensor 101 can sense mutual capacitances between the small row sensor electrodes and the large column sensor electrodes of the sensor array 800.

In one embodiment, the capacitive sensor array 800 may include a set of large sensor electrodes 801, 802, 803, 804, 805, and 806 which may be used as column sensor electrodes. In one embodiment, the capacitive sensor array 800 may include a set of small sensor electrodes, such as sensor electrodes 810-813, each of which is smaller (in area or mass, for example) than any of the large sensor electrodes. The small sensor electrodes may be used as row sensor electrodes. In one embodiment, the large sensor electrodes and small sensor electrodes may be formed from a single layer of conductive material.

In one embodiment, each of the small sensor electrodes in the same row may be sensed independently from other small sensor electrodes in the same row; alternatively, the small sensor electrodes in the same row may be electrically coupled and sensed together. For example, the small sensor electrodes 810-813 may be sensed separately from one another, or they may be coupled together and treated as a single electrode by the capacitance sensor 101 during the sensing scan.

In one embodiment, the active sensing area 830 of the capacitive sensor array 800 includes the area of the sensor array within which the presence of a conductive object may be detected by mutual capacitance or self-capacitance scanning. In one embodiment, the active sensing area 830 may be divisible into a grid of N×M unit cells each corresponding to a sensing region between one of the large sensor electrodes and one of the small sensor electrodes.

In one embodiment, each of the sensor electrodes and shield traces in the sensor array 800 may be electrically connected to their own respective conductive pads, such as pads 809, located within an edge region 834 of the sensor array 800. As illustrated in FIG. 8, the shield trace 814 and small sensor electrode 811 are each connected to one of the conductive pads 809, for example. In one embodiment, each of the sensor electrodes may be electrically connected to their respective conductive pads by one or more routing traces. Some sensor electrodes may include, for example, two or more subelements each connected to a single conductive pad; thus, the single conductive pad may be connected to more than one routing trace. In one embodiment, the edge region 834 in which the conductive pads are located is outside the active sensing area 830 of the capacitive sensor array.

In one embodiment, the area of the capacitive sensor array 800 may include one or more routing channels, such as routing channels 831 and 832. In one embodiment, row sensor electrodes may include one or more subelements connected to routing traces that extend through one of the routing channels to an edge region 834. In one embodiment, row subelements that are on one side of a dividing line 833 may be connected to routing traces located in different routing channels than routing traces connected to subelements that are on the other side of the dividing line 833. For example, subelements that are located below dividing line 833 may be routed to the edge region 834 via routing traces 808, which are located in different routing channels than the routing traces 807 that connect subelements above the dividing line 833 to the edge region 834.

In one embodiment, each unit cell contains a substantially similar pattern of conductive material forming the sensor electrodes within the unit cell. In one embodiment, the pattern within a unit cell on one side of the dividing line 833 may be reversed, or flipped, relative to a pattern within a unit cell on another side of the dividing line 833.

In one embodiment, the dividing line 833 may be located so that ⅔ of the subelements of the small sensor electrodes are on one side of the dividing line 833 and ⅓ of the subelements of the small sensor electrodes are on the other side of the dividing line 833. In alternate embodiments, the dividing line 833 may divide the subelements according to different ratios; for example, the dividing line may be positioned so that half of the subelements of the small sensor electrodes are above the dividing line and half are below.

In one embodiment, the position of the dividing line 833 may be selected in order to balance the widths of the routing channels and the resistance of the small sensor elements. For example, with reference to FIG. 8, the small sensor electrodes that are above the dividing line 833 are connected to routing traces 807 that are longer than the routing traces 808 of the small sensor electrodes below the dividing line 833. Thus, the widths of each of the longer routing traces 807 may be greater than the widths of each of the shorter routing traces 808 to minimize the difference in resistance between the sensor electrodes on either side of the dividing line 833. Accordingly, in one embodiment, the position of dividing line 833 may be chosen so that the routing channel 832 may contain fewer routing traces 807 as compared to routing channel 831, in order to minimize the difference between the widths of the routing channels 831 and 832. In one embodiment, the routing channel 832 may contain fewer routing traces 807 as compared to routing channel 831, in order to accommodate shield traces, such as shield trace 814.

In one embodiment, the capacitive sensor array 800 may include one or more shield traces, which may be grounded to reduce cross-talk between TX and RX sensor electrodes. For example, in an embodiment where the large sensor electrodes are used as TX sensor electrodes and the small sensor electrodes are used as RX sensor electrodes, a shield trace may be located in between certain portions of the small sensor electrodes and the large sensor electrodes. As illustrated in FIG. 8, the shield trace 814, for example, is located between the routing traces in routing channel 832 and the large sensor electrodes surrounding routing channel 832, thus reducing the cross talk between the large sensor electrodes and the routing traces.

In one embodiment, the length of each of the shield traces may be less than the length of the sensor array 800 such that the shield traces do not extend completely from one edge of the sensor array 800 to the opposite edge. In one embodiment, the length of the shield traces may depend on the position of the dividing line 833. For example, the shield traces may extend from an edge region 834 to the dividing line 833.

In the preceding descriptions of capacitive sensor arrays 600, 700, and 800 the small sensor electrodes may be represented as row sensor electrodes and the large sensor electrodes may be represented as column sensor electrodes; however, in one embodiment, the designation of small and large sensor electrodes as row or column sensor electrodes may be interchanged depending on an orientation, for example, of the capacitive sensor array 600 without departing from the spirit and scope of the invention.

It should be noted that alternative embodiments of capacitive sensor patterns having flipped cells may vary with respect to the embodiments illustrated in FIGS. 6A-8. For example, the number of subtraces per unit cell or per sensor electrode and/or the shapes of the subtraces may differ from those of sensor arrays 600 and 700. With reference to sensor array 800 in FIG. 8, shapes other than diamond or triangular shapes may be used in alternative embodiments without departing from the spirit and scope of the invention.

Figure 9A:
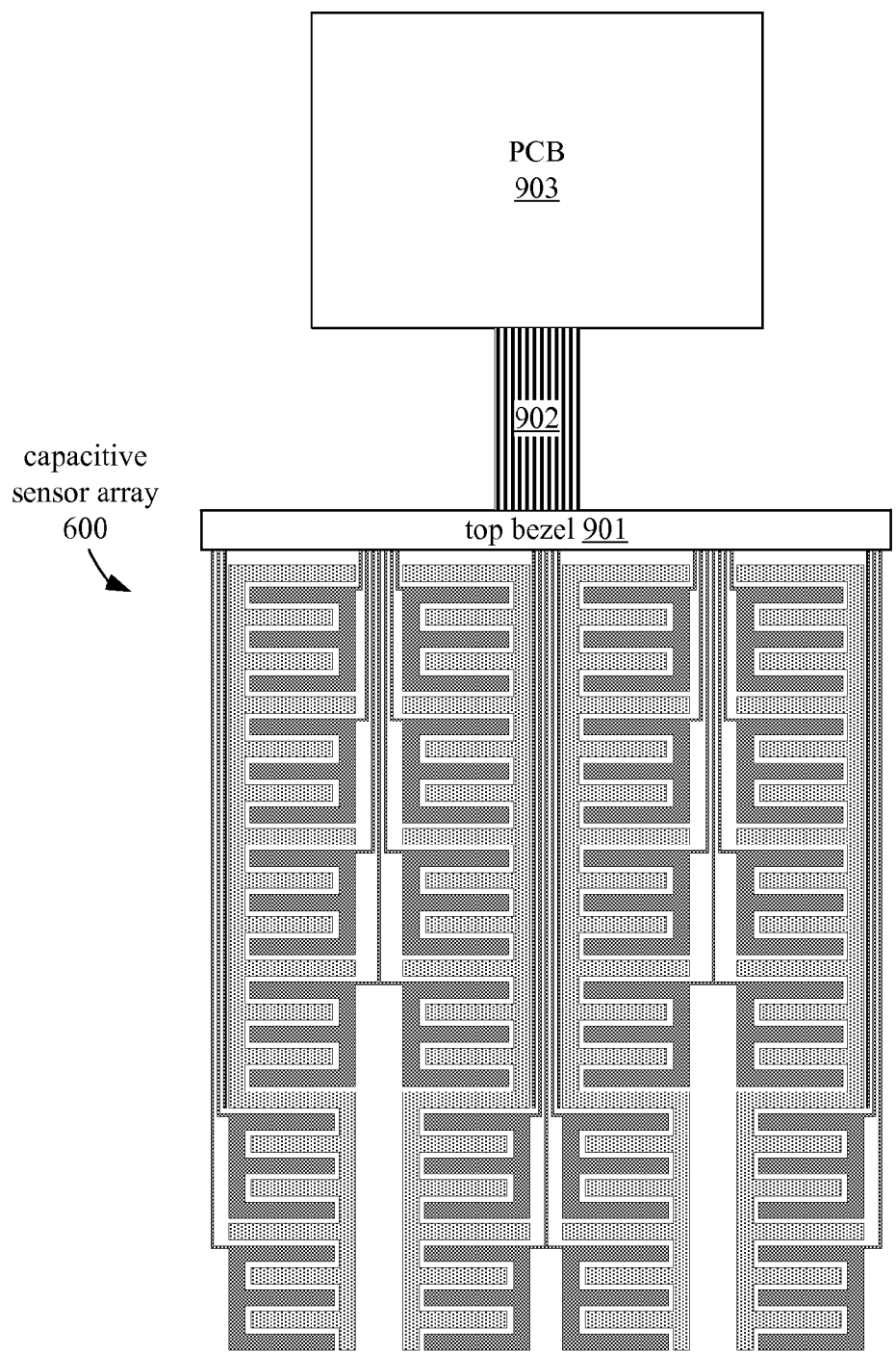
FIGS. 9A and 9B illustrate embodiments of sensor arrays with one or more bezels.

FIG. 9A illustrates an embodiment of a capacitive sensor array 600 connected to a printed circuit board (PCB) 903. In one embodiment, the routing traces of capacitive sensor array 600 extend to the same edge region. In one embodiment, the routing traces may the sensor electrodes of sensor array 600 to conductive pads or pins within the edge region and outside of the active sensing area. In one embodiment, the conductive pads or pins may be hidden by an opaque top bezel 901.

In one embodiment, the sensor electrodes in the array 600 may be connected to circuitry on the PCB 903 via a connector 902. In one embodiment, the connector 902 may be made from conductive material on a flexible substrate. In one embodiment, components of the capacitance sensing system, such as the processing device 110 may be mounted on the PCB 903. In one embodiment, other hardware, such as hardware supporting a display over which the sensor array is overlaid, may also be mounted on PCB 903.

In one embodiment, one or more of the sensor electrodes in array 600 may be connected together; for example, each of the small sensor electrodes including subelements that are in the same row of unit cells may be electrically coupled together and sensed together as a single unit. In one embodiment, some or all of these connections between sensor electrodes may be established by one or more switches, multiplexers, conductive traces, or other conductive paths that may reside on or underneath the bezel 901, on the PCB 903, or on some other part of the sensor array assembly. In an alternative embodiment, the separate sensor electrodes may be sensed separately.

Figure 9B:
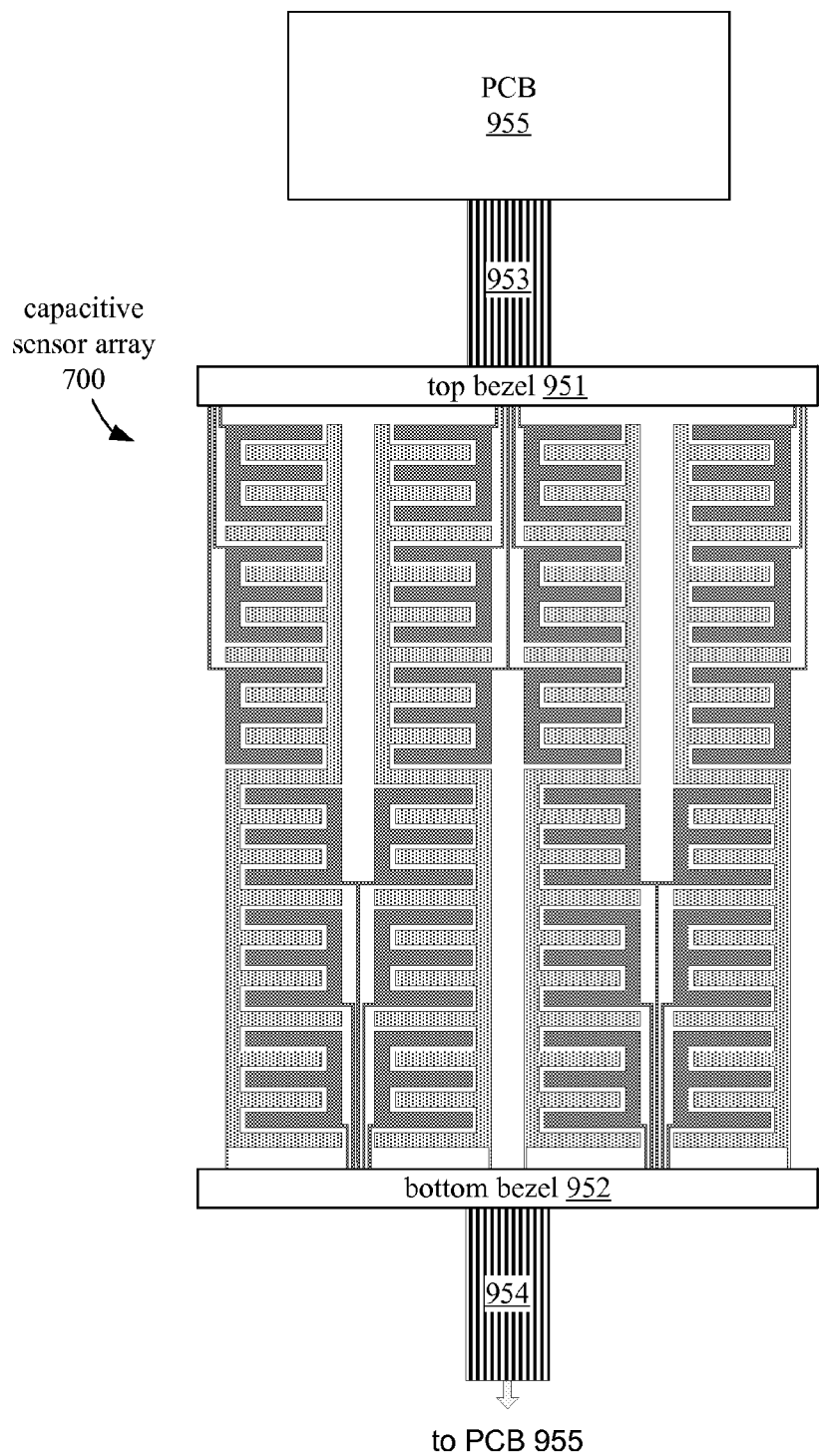

FIG. 9B illustrates an embodiment of a sensor array 700 having routing traces that lead in opposite directions to a top edge region hidden by a top bezel 951 and a bottom edge region hidden by a bottom bezel 952. In one embodiment, routing traces that are electrically connected to a particular subelement extend towards the one of two opposite edge regions of the sensor array that is nearer to the particular subelement in order to minimize the length of the routing trace. For example, the subelements of small sensor electrodes nearest the top bezel 951 may be connected to routing traces that extend towards the top bezel 951, while the subelements of small sensor electrodes nearest the bottom bezel 952 may be connected to routing traces that extend toward the bottom bezel 952.

In one embodiment, the sensor electrodes in the array 700 may be connected to circuitry on a printed circuit board (PCB) 955 via connectors 953 and 954. In one embodiment, one or both of the connectors 953 and 954 may be made from conductive material on a flexible substrate. In one embodiment, components of the capacitance sensing system, such as the processing device 110 may be mounted on the PCB 955. In one embodiment, other hardware, such as hardware supporting a display over which the sensor array is overlaid, may also be mounted on PCB 955.

In one embodiment, one or more of the sensor electrodes in array 700 may be connected together; for example, each of the small sensor electrodes that are in the same row of unit cells may be electrically coupled together and sensed together as a unit. In one embodiment, some or all of these connections between sensor electrodes may be established by one or more switches, multiplexers, conductive traces, or other conductive paths that may reside on or underneath one or both of the bezels 951 and 952, on the PCB 955, or on some other part of the sensor array assembly.

In the foregoing embodiments, various modifications can be made; for example, row sensor electrodes and column sensor electrodes may be interchanged, and row or column sensor electrodes may be used as either TX or RX sensor electrodes. Furthermore, in some embodiments, intersections between row and column sensor electrodes may be replaced with conductive bridges. For example, bridges may be used to electrically connect portions of sensor electrodes when both row and column sensor electrodes are constructed from a single layer of conductive material. As described herein, conductive electrodes that are "electrically connected" or "electrically coupled" may be coupled such that a relatively low resistance conductive path exists between the conductive electrodes.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A capacitive sensor array, comprising:
  a plurality of large sensor electrodes; and
  for each large sensor electrode of the plurality of large sensor electrodes;
    a first plurality of small sensor electrodes each capacitively coupled with the large sensor electrode, and each conductively coupled by one of a first set of routing traces to one of a first set of conductors located in a first edge region; and
    a second plurality of small sensor electrodes capacitively coupled with the large sensor electrode and conductively coupled by a second set of routing traces to a second set of conductors in a second edge region, wherein:
    each of the first plurality of small sensor electrodes is interleaved with a first side of the large sensor electrode according to a first pattern;
    each of the second plurality of small sensor electrodes is interleaved with a second opposite side of the large sensor electrode according to a second pattern that is a mirror opposite of the first pattern;
    an active sensing region of the capacitive sensor array is located between the first edge region and the second edge region;
    the first set of routing traces is located in a first routing channel and the second set of routing traces is located in a second routing channel; and
    the first routing channel and the second routing channel are located along the first and second sides respectively of the large sensor electrode;
  wherein the plurality of large sensor electrodes and the corresponding interleaved small sensor electrodes are formed from a single layer of conductive material.

2. The capacitive sensor array of claim 1, wherein each of the first plurality of small sensor electrodes is closer to the first edge region than to the second edge region, wherein each of the second plurality of small sensor electrodes is closer to the second edge region than to the first edge region, and wherein each of the first set of conductors and the second set of conductors is a conductive pad.

3. The capacitive sensor array of claim 1, wherein for each large sensor electrode of the plurality of large sensor electrodes, at least a portion of the large sensor electrode is located between two interior points of each small sensor electrode of the first and second pluralities of small sensor electrodes.

4. The capacitive sensor array of claim 1, wherein for each large sensor electrode of the plurality of large sensor electrodes, each small sensor electrode of the first plurality of small sensor electrodes is conductively coupled with an adjacent small sensor electrode that is capacitively coupled with an adjacent large sensor electrode of the plurality of large sensor electrodes.

5. The capacitive sensor array of claim 1, wherein for at least one routing trace of the first set of routing traces, at least a portion of the routing trace is located between two other routing traces that are conductively coupled to each other.

6. The capacitive sensor array of claim 1, wherein for each large sensor electrode of the plurality of large sensor electrodes, each routing trace of the first set and the second set of routing traces is shorter than the large sensor electrode.

7. The capacitive sensor array of claim 1, wherein for each large sensor electrode of the plurality of large sensor electrodes, a central longitudinal axis of the large sensor electrode intersects each small sensor electrode of the first and second sets of small sensor electrodes.

8. A capacitive sensor array, comprising:
  a plurality of column sensor electrodes, wherein each column sensor electrode of the plurality of column sensor electrodes comprises a main trace extending from a first end of the column sensor electrode to a second end of the column sensor electrode; and
  for each column sensor electrode of the plurality of column sensor electrodes:
    a first plurality of row sensor electrodes, each capacitively coupled with the column sensor electrode and each conductively coupled by one of a first set of routing traces to a first edge region; and
    a second plurality of row sensor electrodes, each capacitively coupled with the column sensor electrode and each conductively coupled by one of a second set of routing traces to a second edge region on an opposite side of an active sensing area of the capacitive sensor array from the first edge region, wherein:
    each of the first plurality of row sensor electrodes is interleaved with a first side of the column sensor electrode according to a first pattern;
    each of the second plurality of row sensor electrodes is interleaved with a second opposite side of the column sensor electrode according to a second pattern that is a mirror opposite of the first pattern; and
    the first set of routing traces and the second set of routing traces are located along the first and second sides respectively of the column sensor electrode,
  the plurality of column sensor electrodes and the corresponding interleaved row sensor electrodes are formed from a same layer of conductive material.

9. The capacitive sensor array of claim 8, wherein each of the first plurality of row sensor electrodes is closer to the first edge region than to the second edge region, and wherein each of the second plurality of row sensor electrodes is closer to the second edge region than to the first edge region.

10. The capacitive sensor array of claim 8, wherein for each column sensor electrode of the plurality of column sensor electrodes, each row sensor electrode of the first plurality of row sensor electrodes is conductively coupled with an adjacent row sensor electrode that is capacitively coupled with an adjacent column sensor electrode of the plurality of column sensor electrodes.

11. The capacitive sensor array of claim 8, wherein for at least one routing trace of the first set of routing traces, at least a portion of the routing trace is located between two other routing traces that are conductively coupled to each other.

12. The capacitive sensor array of claim 8, wherein for each column sensor electrode of the plurality of column sensor electrodes, each routing trace of the first set and the second set of routing traces is shorter than the column sensor electrode.

13. The capacitive sensor array of claim 8, wherein for each column sensor electrode of the plurality of column sensor electrodes, a central longitudinal axis of the column sensor electrode intersects each row sensor electrode of the first and second sets of row sensor electrodes.

14. A capacitance sensing system, comprising:
a capacitance sensor;
a plurality of large sensor electrodes of a capacitive sensor array, each of the large sensor electrodes coupled with the capacitance sensor; and
for each large sensor electrode of the plurality of large sensor electrodes:
   a first plurality of small sensor electrodes coupled with the capacitance sensor, each capacitively coupled with the large sensor electrode, and each conductively coupled by a first set of routing traces to at least one of a first set of conductors in a first edge region; and
   a second plurality of small sensor electrodes coupled with the capacitance sensor, each capacitively coupled with the large sensor electrode, and each conductively coupled by a second set of routing traces to at least one of a second set of conductors in a second edge region, wherein:
   each of the first plurality of small sensor electrodes is interleaved with a first side of the large sensor electrode according to a first pattern;
   each of the second plurality of small sensor electrodes is interleaved with a second opposite side of the large sensor electrode according to a second pattern that is a mirror opposite of the first pattern;
   an active sensing region of the capacitive sensor array is located between the first edge region and the second edge region;
   the first set of routing traces is located in a first routing channel and the second set of routing traces is located in a second routing channel;
   the first routing channel and the second routing channel are located along the first and second sides respectively of the large sensor electrode;
wherein the plurality of large sensor electrodes and the corresponding interleaved small sensor electrodes are formed from a single layer of conductive material.

15. The capacitance sensing system of claim 14, wherein the capacitance sensor is configured to measure mutual capacitances between each of the plurality of large sensor electrodes and each of the plurality of small sensor electrodes.

16. The capacitance sensing system of claim 14, wherein for the first set of routing traces, a portion of at least one of the first set of routing traces is located between two other routing traces of the first set of routing traces that are conductively coupled to each other.

17. The capacitance sensing system of claim 14, wherein each large sensor electrode has a rotational symmetry with respect to a center point of the respective large sensor electrode.

18. The capacitance sensing system of claim 14, wherein the plurality of large sensor electrodes includes a first large sensor electrode and a second sensor electrode that are disposed adjacent to each other, and the first large sensor electrode and its corresponding first and second pluralities of small sensor electrodes mirror the second large sensor electrode and its corresponding first and second pluralities of small sensor electrodes.

* * * * *

UNITED STATES PATENT AND TRADEMARK OFFICE
CERTIFICATE OF CORRECTION

PATENT NO. : 9,547,031 B2  
APPLICATION NO. : 14/303881  
DATED : January 17, 2017  
INVENTOR(S) : Weng et al.

Page 1 of 1

It is certified that error appears in the above-identified patent and that said Letters Patent is hereby corrected as shown below:

In the Claims

Claim 1, Column 17, Line 26, please delete "electrodes each" and insert --electrodes, each--.

Signed and Sealed this  
Fourth Day of April, 2017

Michelle K. Lee  
*Director of the United States Patent and Trademark Office*